(12) United States Patent
Lee et al.

(10) Patent No.: US 8,999,527 B2
(45) Date of Patent: Apr. 7, 2015

(54) SIMPLIFIED ORGANIC ELECTRONIC DEVICE EMPLOYING POLYMERIC ANODE WITH HIGH WORK FUNCTION

(75) Inventors: Tae-Woo Lee, Pohang-si (KR); Seong-Hoon Woo, Daegu (KR)

(73) Assignee: Postech Academy-Industry Foundation, Pohang-Si, Kyungsangbuk-Do (KR)

( * ) Notice: Subject to any disclaimer, the term of this patent is extended or adjusted under 35 U.S.C. 154(b) by 456 days.

(21) Appl. No.: 13/481,472

(22) Filed: May 25, 2012

(65) Prior Publication Data

US 2012/0298974 A1    Nov. 29, 2012

(30) Foreign Application Priority Data

May 27, 2011    (KR) .................. 10-2011-0050845

(51) Int. Cl.
*H01L 51/50* (2006.01)
*H01L 51/10* (2006.01)
*H01L 51/52* (2006.01)
*C08L 27/18* (2006.01)
*C08G 65/00* (2006.01)
*H01L 51/05* (2006.01)
*H01L 29/06* (2006.01)
*H01L 29/16* (2006.01)

(52) U.S. Cl.
CPC .......... *H01L 51/105* (2013.01); *H01L 51/5206* (2013.01); *C08L 27/18* (2013.01); *C08G 65/007* (2013.01); *H01L 51/0545* (2013.01); *H01L 51/5218* (2013.01); *H01L 29/0669* (2013.01); *H01L 29/1606* (2013.01); *H01L 2251/5338* (2013.01); *H01L 2251/5346* (2013.01); *H01L 2251/5369* (2013.01); *H01L 2251/55* (2013.01); *Y02E 10/549* (2013.01); *Y10S 428/917* (2013.01)

(58) Field of Classification Search
None
See application file for complete search history.

(56) References Cited

U.S. PATENT DOCUMENTS

| 7,728,098 B2 | 6/2010 | Dams et al. | |
| 2011/0068329 A1* | 3/2011 | Buchholz et al. | ............... 257/40 |
| 2011/0168952 A1 | 7/2011 | Hsu | |

FOREIGN PATENT DOCUMENTS

| JP | 2010-514904 | 5/2010 |
| KR | 10-2007-0081623 | 8/2007 |
| WO | 2008/082663 | 7/2008 |

OTHER PUBLICATIONS

Park et al., Layer by Layer Spin Self-Assembled Hole Injection layers . . . Light Emitting Diodes, 2007, Molecular Rapid Communications, vol. 28, Issue 13, p. 1366-1372.*

* cited by examiner

*Primary Examiner* — Gregory Clark
(74) *Attorney, Agent, or Firm* — Kile Park Reed & Houtteman PLLC

(57) ABSTRACT

An electronic device employing a polymeric anode with high work function.

16 Claims, 10 Drawing Sheets

US 8,999,527 B2

SIMPLIFIED ORGANIC ELECTRONIC DEVICE EMPLOYING POLYMERIC ANODE WITH HIGH WORK FUNCTION

CROSS-REFERENCE TO RELATED PATENT APPLICATION

This application claims the benefit of Korean Patent Application No. 10-2011-0050845, filed on May 27, 2011, in the Korean Intellectual Property Office, the disclosure of which, is incorporated herein in its entirety by reference.

BACKGROUND OF THE INVENTION

1. Field of the Invention

The present invention relates to a simplified organic electronic device including a polymeric anode with high work function.

2. Description of the Related Art

Organic light-emitting devices, which are self-emitting devices, have advantages such as a wide viewing angle, excellent contrast, quick response, high brightness, excellent driving voltage characteristics, and can provide multicolored images.

A conventional organic light-emitting device includes an anode, a cathode, and an organic layer interposed between the anode and the cathode. The organic layer may include an electron injection layer (EIL), a hole transport layer (HTL), an emission layer (EML), an electron transport layer (ETL), and a cathode. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

Meanwhile, much research into renewable energy has been conducted worldwide. In this regard, organic solar cells have drawn much attention because of their potential of using solar energy as a future energy source. Organic solar cells can more efficiently form a thin film and can be manufactured with low manufacturing costs compared to inorganic solar cells using silicon, and thus can be applied to various flexible devices.

The cost of indium tin oxide (ITO) electrodes that are commonly used in organic light-emitting diodes and organic solar cells has continued to increase due to exhaustion of indium, and the ITO is brittle and liable to break upon impact or bending. Thus, ITO cannot be applied to flexible devices. Although research into electrodes for replacing the ITO has been conducted, developed electrodes do not have sufficient work function. Thus, a multi-layered structure for smoothly injecting and transporting charges is formed on the electrode. However, this structure increases the amount of materials and manufacturing costs for preparing electronic devices. Thus, there is a need to develop organic electronic devices having a simplified structure with excellent performance by using a flexible electrode having high work function but not using a hole transport/extraction auxiliary layer, and to apply the organic electronic devices to flexible devices as well as conventional flat panel devices.

SUMMARY OF THE INVENTION

The present invention provides a simplified electronic device including a flexible electrode with high conductivity and high work function.

According to an aspect of the present invention, there is provided an electronic device employing a high-work-function and high-conductivity electrode that includes a conductive material having a conductivity of 0.1 S/cm or more and a low-surface-energy material and has a first surface and a second surface opposite to the first surface, wherein the concentration of the low-surface-energy material in the second surface is greater than that of the low-surface-energy material of the first surface, and a work function of the second surface is 5.0 eV or more.

The concentration of the low-surface-energy material gradually may increase in a direction from the first surface to the second surface.

The low-surface-energy material may be a fluorinated material having at least one F.

The conductive material may include polythiophene, polyaniline, polypyrrole, polystyrene, sulfonated polystyrene, poly(3,4-ethylenedioxythiophene), self-doped conductive polymer, any derivative thereof, and any combination thereof.

The high-work-function and high-conductivity electrode may further include at least one of a metal nanowire, a semiconductor nanowire, a metal nanodot, graphene, reduced graphene oxide, and graphite.

The metal nanowire may be selected from the group consisting of Ag, Au, Cu, Pt, nickel silicide (NiSi$_x$), metallic carbon nanotube, and any composite, e.g., alloy or core-shell structure, of at least two thereof, but is not limited thereto.

The semiconductor nanowire may be selected from the group consisting of Si, Ge, Si doped with B or N, Ge doped with B or N, and any composite, e.g., alloy or core-shell structure, of at least two thereof, but is not limited thereto.

The metal nanodot may be selected from the group consisting of Ag, Au, Cu, Pt, and any composite, e.g., alloy or core-shell structure, of at least two thereof, but is not limited thereto.

At least one moiety represented by —S($Z_{100}$) or —Si($Z_{101}$)($Z_{102}$)($Z_{103}$) may be attached to the surface of the metal nanowire, the semiconductor nanowire, and the metal nanodot, wherein $Z_{100}$, $Z_{101}$, $Z_{102}$, and $Z_{103}$ are each independently a hydrogen atom, a halogen atom, a substituted or unsubstituted $C_1$-$C_{20}$ alkyl group, or a substituted or unsubstituted $C_1$-$C_{20}$ alkoxy group.

A work function of the second surface may be in the range of 5.0 eV to 6.5 eV. For example, a work function of the second surface may be in the range of 5.3 eV to 6.2 eV.

The electronic device may include an organic light-emitting device, an organic solar cell, an organic memory device, or an organic thin film transistor, but are not limited thereto. All types of organic electronic devices, inorganic electronic devices, and energy devices may be used.

If the electronic devices are an organic light-emitting device including an emission layer having an ionization potential of 5.0 eV or more greater than a work function of a general indium tin oxide (ITO) electrode, which is in the range of about 4.7 to 4.9 eV, by 0.3 eV or more, a high-work-function and high-conductivity electrode according to the present invention may be used instead of the ITO anode. In this regard, the second surface of the high-work-function and high-conductivity electrode may face the emission layer. In addition, the second surface of the high-work-function and high-conductivity electrode may contact with the emission layer. Alternatively, a hole transport layer may be selectively interposed between the high-work-function and high-conductivity electrode and the emission layer. Here, the second surface of the high-work-function and high-conductivity electrode may contact with the hole transport layer. In general, a hole injection layer and a hole transport layer are interposed between the ITO anode and the emission layer. However, the HIL and/or the HTL may not be formed since the high-work-function and high-conductivity electrode is used. Accordingly, a flexible organic light-emitting display device as well as a flat panel organic light-emitting display device may be manufactured using the high-work-function and high-conductivity electrode, and the structure of the organic light-emitting device may be simplified.

Meanwhile, if the electronic device is an organic solar cell including a photoactive layer having an ionization potential of 5.0 eV or more greater than a work function of a general ITO electrode by 0.3 eV or more, a high-work-function and high-conductivity electrode according to the present invention may be used instead of the ITO anode. In this regard, the second surface of the high-work-function and high-conductivity electrode may face the photoactive layer. Here, the second surface of the high-work-function and high-conductivity electrode may contact with the photoactive layer. In general, a hole extraction layer is interposed between the ITO anode and the photoactive layer. However, the hole extraction layer may not be formed since the high-work-function and high-conductivity electrode is used. Accordingly, a flexible organic solar cell as well as a flat panel solar cell may be manufactured using the high-work-function and high-conductivity electrode, and the structure of the organic solar cell may be simplified.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the accompanying drawing.

As used herein, the term "and/or" includes any and all combinations of one or more of the associated listed items. Expressions such as "at least one of," when preceding a list of elements, modify the entire list of elements and do not modify the individual elements of the list.

Figure 1:
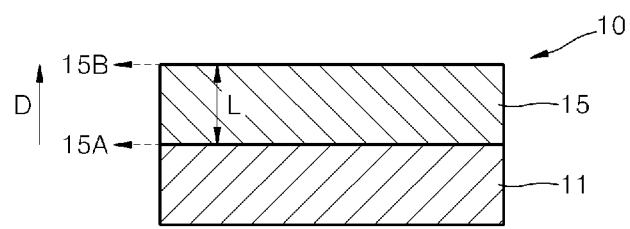
FIG. 1 is a schematic cross-sectional view of an electrode according to an embodiment of the present invention.

FIG. 1 is a schematic cross-sectional view of a high-work-function and high-conductivity electrode 15 and a substrate 10 according to an embodiment of the present invention.

The high-work-function and high-conductivity electrode 15 includes a conductive material having a conductivity of 0.1 S/cm or more and a low-surface-energy material. The high-work-function and high-conductivity electrode 15 has a first surface 15A and a second surface 15B that is opposite to the first surface 15A. A concentration of the low-surface-energy material in the second surface 15B is greater than that of the low-surface-energy material in the first surface 15A. The second surface 15B may have a work function of 5.0 eV or more. The conductivity of the high-work-function and high-conductivity electrode 15 having a thickness of 100 nm is 1 S/cm or greater.

The "low-surface-energy material" used herein refers to a material capable of forming a film having a low surface energy, particularly, a material having a lower surface energy than the conductive material. In a composition including the low-surface-energy material and the conductive material, phase segregation occurs due to a difference in surface energy between the low-surface-energy material and the conductive material, so that the low-surface-energy material forms an upper phase, and the conductive material forms a lower phase. The low-surface-energy material includes at least one F and may have higher hydrophobicity than the conductive material. In addition, the low-surface-energy material may be a material capable of providing higher work function than the conductive material. For example, a thin film having a thickness of 100 nm and formed of the low-surface-energy material may have a surface energy of 30 mN/m or less and a conductivity in the range of $10^{-15}$ to $10^{-1}$ S/cm. In addition, a thin film having a thickness of 100 nm and formed of a conductive polymer composition including the low-surface-energy material may have a surface energy of 30 mN/m or less and a conductivity in the range of $10^{-7}$ to $10^{-1}$ S/cm.

Thus, when a composition for forming an electrode including the conductive material and the low-surface-energy material is applied to the substrate 10, the conductive material and the low-surface-energy material cannot be homogeneously mixed with each other due to low surface energy of the low-surface-energy material. Instead, the conductive material and the low-surface-energy material may be distributed such that the concentration of the low-surface-energy material gradually increases in a direction from the first surface 15A to the second surface 15B, and relatively, the concentration of the conductive material gradually increases in a direction from the second surface 15B to the first surface 15A. Then, the composition for forming an electrode including the conductive material and the low-surface-energy material and applied to the substrate 10 is baked to form the high-work-function and high-conductivity electrode 15 in which the concentration of the low-surface-energy material gradually increases in a direction from the first surface 15A to the second surface 15B.

Since the high-work-function and high-conductivity electrode 15 is formed through self-organization of the conductive material and the low-surface-energy material by performing a one solution film-forming process, it has a single layered structure in which a boundary between the conductive material layer and the low-surface-energy material layer is not recognizable.

The work function of the first surface 15A of the high-work-function and high-conductivity electrode 15 may be equal to or greater than that of the conductive material, and the work function of the second surface 15B of the high-work-function and high-conductivity electrode 15 may be equal to or less than that of the low-surface-energy material, but the work function is not limited thereto.

The low-surface-energy material may be a material that has a solubility of 90% or more, for example, 95% or more, in a polar solvent. Examples of the polar solvent include water, alcohol (methanol, ethanol, n-propanol, 2-propanol, n-butanol, and the like), ethylene glycol, glycerol, dimethylformamide (DMF), dimethylsulfoxide (DMSO), acetone, and the like, but are not limited thereto.

The low-surface-energy material may include at least one F. For example, the low-surface-energy material may be a fluorinated polymer or a fluorinated oligomer having at least one F.

According to an embodiment of the present invention, the low-surface-energy material may be a fluorinated polymer having a repeating unit represented by one of Formulae 1 to 3 below.

$$*\!-\!\!\left[CF_2\!-\!CF_2\right]_a\!\!\left[\begin{array}{c}CF\!-\!CF_2\\|\\Q_1\end{array}\right]_b\!\!-\!*$$ Formula 1

In Formula 1, a is a number from 0 to 10,000,000;
b is a number of 1 to 10,000,000; and
$Q_1$ is —[O—C($R_1$)($R_2$)—C($R_3$)($R_4$)]$_c$—[OCF$_2$CF$_2$]$_d$—$R_5$, —COOH, or —O—$R_f$—$R_6$;
wherein $R_1$, $R_2$, $R_3$ and $R_4$ are each independently —F, —CF$_3$, —CHF$_2$, or —CH$_2$F;
c and d are each independently a number from 0 to 20;
$R_f$ is —(CF$_2$)$_n$—, wherein z is an integer from 1 to 50, or —(CF$_2$CF$_2$O)$_z$—CF$_2$CF$_2$—, wherein z is an integer from 1 to 50; and
$R_5$ and $R_6$ are each independently —SO$_3$M, —PO$_3$M$_2$, or —CO$_2$M;
wherein M is Na$^+$, K$^+$, Li$^+$, H$^+$, CH$_3$(CH$_2$)$_w$NH$_3^+$, NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$, wherein w is an integer from 0 to 50.

$$*\!-\!\!\left[CH_2\!-\!CH\right]_p\!\!\left[\begin{array}{cc}H_2 & Q_3\\|& |\\C & -C\\| & |\\Q_2 & Q_4\end{array}\right]_q\!\!-\!*.$$ Formula 2

In Formula 2, $Q_2$ is a hydrogen atom, a substituted or unsubstituted $C_5$-$C_{50}$ aryl group, or —COOH;
$Q_3$ is a hydrogen atom or a substituted or unsubstituted $C_1$-$C_{20}$ alkyl group;

$Q_4$ is —O—(CF$_2$)$_r$—SO$_3$M, —O—(CF$_2$)$_r$—PO$_3$M$_2$, —O—(CF$_2$)$_r$—CO$_2$M, or —CO—NH—(CH$_2$)$_s$—(CF$_2$)$_t$—CF$_3$,
wherein r, s and t are each independently a number from 0 to 20; and
M is Na$^+$, K$^+$, Li$^+$, H$^+$, CH$_3$(CH$_2$)$_w$NH$_3^+$, NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$, wherein w is an integer from 0 to 50.

Formula 3

$$-\!\!\left[CH_2\!-\!CH\right]_m\!\!-\!\!\left[CF\!-\!CF_2\right]_n\!\!-$$
with phenyl bearing Y substituent and side chain (O—CF—CF$_2$)$_x$(O—CF$_2$—CF$_2$)$_y$—CF$_3$ where the CF bears CF$_3$ In Formula 3, 0≤m<10,000,000, and 0<n≤10,000,000;
x and y are each independently a number from 0 to 20; and
Y is —SO$_3$M, —PO$_3$M$_2$, or —CON;
wherein M is Na$^+$, K$^+$, Li$^+$, H$^+$, CH$_3$(CH$_2$)$_w$NH$_3^+$, NH$_4^+$, NH$_2^+$, NHSO$_2$CF$_3^+$, CHO$^+$, C$_2$H$_5$OH$^+$, CH$_3$OH$^+$, or CH$_3$(CH$_2$)$_w$CHO$^+$, wherein w is an integer from 0 to 50.

For example, the low-surface-energy material may be a fluorinated polymer including a repeating unit represented by Formula 1, but is not limited thereto.

For example, the low-surface-energy material is a fluorinated polymer including a repeating unit represented by Formula 1, wherein a is a number from 100 to 10000, b is a number from 50 to 1000, and $Q_1$ is —[O—C($R_1$)($R_2$)—C($R_3$)($R_4$)]$_c$—[OCF$_2$CF$_2$]$_d$—$R_5$.

For example, the low-surface-energy material may be a fluorinated polymer including a repeating unit represented by Formula 1, wherein a is a number from 100 to 10000, b is a number from 50 to 1000, $Q_1$ is —[O—C($R_1$)($R_2$)—C($R_3$)($R_4$)]$_c$—[OCF$_2$CF$_2$]$_d$—$R_5$, wherein c is a number from 1 to 3, $R_1$, $R_2$ and $R_3$ are —F, $R_4$ is —CF$_3$, d is a number from 1 to 3, and $R_5$ is —SO$_3$M, but the low-surface-energy material is not limited thereto.

Meanwhile, the low-surface-energy material may be a silane fluoride-based material represented by Formula 10 below.

$$X\text{-}M^f_n\text{-}M^h_m\text{-}M^a_r\text{-}(G)_p$$ Formula 10

In Formula 10,
X is a terminal group;
$M^f$ is a unit derived from a fluorinated monomer prepared by condensation reaction of perfluoropolyether alcohol, polyisocyanate, and an isocyanate reactive-non-fluorinated monomer or a fluorinated $C_1$-$C_{20}$ alkylene group;
$M^h$ is a unit derived from a non-fluorinated monomer;
$M^a$ is a unit having a silyl group represented by —Si($Y_4$)($Y_5$)($Y_6$),
wherein, $Y_4$, $Y_5$ and $Y_6$ are each independently a halogen atom, a substituted or unsubstituted $C_1$-$C_{20}$ alkyl group, a substituted or unsubstituted $C_6$-$C_{30}$ aryl group, or a hydrolysable substituent, wherein at least one of the $Y_4$, $Y_5$ and $Y_6$ is a hydrolysable substituent,
G is a monovalent organic group including a chain transfer agent;
n is a number from 1 to 100,
m is a number from 0 to 100,
r is a number from 0 to 100;
wherein n+m+r≥2; and
p is a number from 0 to 10.

For example, X may be a halogen atom, $M^f$ may be a fluorinated $C_1$-$C_{10}$ alkylene group, $M^h$ may be a $C_2$-$C_{10}$ alkylene group, $Y_4$, $Y_5$ and $Y_6$ may be each independently a halogen atom (Br, Cl, F, or the like), and p may be 0. For example, the silane fluoride-based material represented by Formula 10 may be $CF_3CH_2CH_2SiCl_3$, but is not limited thereto.

The silane fluoride-based material represented by Formula 10 is described in U.S. Pat. No. 7,728,098, the disclosure of which is incorporated herein in its entirety by reference.

The conductive material may be a conductive polymer having a high conductivity of 0.1 S/cm or more, for example, 1 S/cm or more.

For example, the conductive material may include polythiophene, polyaniline, polypyrrole, polystyrene, sulfonated polystyrene, poly(3,4-ethylenedioxythiophene), self-doped conductive polymer, and any derivative and combination thereof. The derivative may include various sulfonic acids.

For example, the conductive material may include polyaniline/dodecylbenzenesulfonic acid (Pani:DBSA, refer to the following formula), poly(3,4-ethylenedioxythiophene)/poly(4-styrenesulfonate) (PEDOT:PSS, refer to the following formula), polyaniline/camphor sulfonic acid (Pani:CSA), or polyaniline/poly(4-styrenesulfonate) (PANI:PSS), but is not limited thereto.

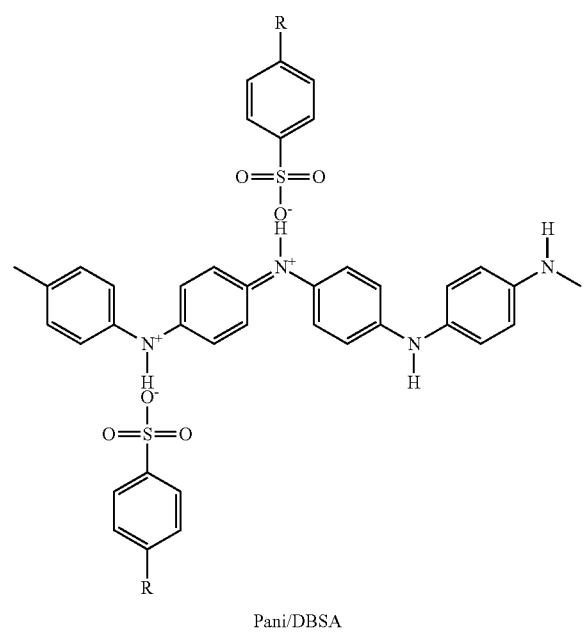

Pani/DBSA

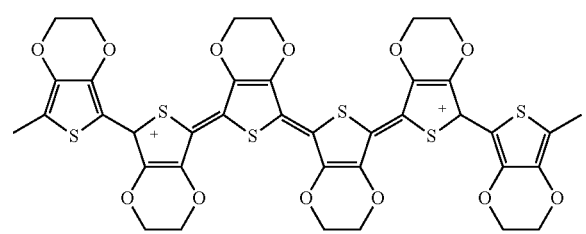

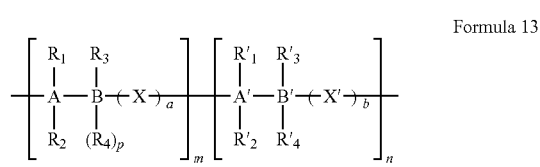

PEDOT/PSS

Here, R may be H or a $C_1$-$C_{10}$ alkyl group.

The self-doped conductive polymer may have a degree of polymerization in the range of 10 to 10,000,000 and may include a repeating unit represented by Formula 13 below.

$$\left[ \begin{array}{c} R_1 \quad R_3 \\ | \quad | \\ -A-B-(X)_a \\ | \quad | \\ R_2 \quad (R_4)_p \end{array} \right]_m \left[ \begin{array}{c} R'_1 \quad R'_3 \\ | \quad | \\ -A'-B'-(X')_b \\ | \quad | \\ R'_2 \quad R'_4 \end{array} \right]_n$$

Formula 13

In Formula 13, 0<m<10,000,000, 0<n<10,000,000, 0≤a≤20, and 0≤b≤20;

at least one of $R_1$, $R_2$, $R_3$, $R'_1$, $R'_2$, $R'_3$ and $R'_4$ includes an ionic group, and A, B, A', and B' are each independently selected from the group consisting of C, Si, Ge, Sn, and Pb;

$R_1$, $R_2$, $R_3$, $R'_1$, $R'_2$, $R'_3$ and $R'_4$ are each independently selected from the group consisting of a hydrogen atom, a halogen atom, a nitro group, a substituted or unsubstituted amino group, a cyano group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_5$-$C_{30}$ arylalkyl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroarylalkyl group, a substituted or unsubstituted $C_2$-$C_{30}$ heteroaryloxy group, a substituted or unsubstituted $C_5$-$C_{30}$ cycloalkyl group, a substituted or unsubstituted $C_5$-$C_{30}$ heterocycloalkyl group, a substituted or unsubstituted $C_1$-$C_{30}$ alkylester group, and a substituted or unsubstituted $C_6$-$C_{30}$ arylester group, wherein a hydrogen atom or a halogen atom is selectively adhered to carbon of the repeating unit of Formula 13;

$R_4$ is a conjugated conductive polymer chain; and

X and X' are each independently selected from the group consisting of a single bond, O, S, a substituted or unsubstituted $C_1$-$C_{30}$ alkylene group, a substituted or unsubstituted $C_1$-$C_{30}$ heteroalkylene group, a substituted or unsubstituted $C_6$-$C_{30}$ arylene group, a substituted or unsubstituted $C_6$-$C_{30}$ arylalkylene group, a substituted or unsubstituted $C_2$-$C_{30}$ heteroarylene group, a substituted or unsubstituted $C_2$-$C_{30}$ heteroarylalkylene group, a substituted or unsubstituted $C_5$-$C_{20}$ cycloalkylene group, and a substituted or unsubstituted $C_5$-$C_{30}$ heterocycloalkylene, wherein a hydrogen atom or a halogen atom is selectively adhered to carbon of the repeating unit of Formula 13.

For example, the ionic group may be selected from the group consisting of an anionic group selected from the group consisting of $PO_3^{2-}$, $SO_3^-$, $COO^-$, $I^-$, and $CH_3COO^-$, a metal ion selected from the group consisting of $Na^+$, $K^+$, $Li^+$, $Mg^{+2}$, $Zn^{+2}$, and $Al^{+3}$, and an organic ion selected from the group consisting of $H^+$, $NH_4^+$, and $CH_3(-CH_2-)_nO^+$, wherein n is a natural number from 1 to 50. The ionic group may further include a cationic group matching the anionic group.

For example, in the self-doped conductive polymer of Formula 13, at least one of $R_1$, $R_2$, $R_3$, $R'_1$, $R'_2$, $R'_3$, and $R'_4$ may be fluorine or a group substituted with fluorine, but the self-doped conductive polymer is not limited thereto.

Examples of the unsubstituted alkyl group include a linear or branched alkyl group, such as methyl, ethyl, propyl, isobutyl, sec-butyl, tert-butyl, pentyl, iso-amyl, and hexyl. One or more hydrogen atoms in the alkyl group may be substituted with a halogen atom, a hydroxy group, a nitro group, a cyano group, a substituted or unsubstituted amino group ($-NH_2$, $-NH(R)$, or $-N(R')(R'')$, wherein R' and R" are each independently a $C_1$-$C_{10}$ alkyl group), an amidino group, hydrazine, hydrazone, a carboxyl group, a sulfonic acid group, a phosphoric acid group, a $C_1$-$C_{20}$ alkyl group, a $C_1$-$C_{20}$ halogenated alkyl group, a $C_1$-$C_{20}$ alkenyl group, a $C_1$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

The heteroaryl group is a radical formed as a result of replacing one or more carbon atoms, for example, 1 to 5 carbon atoms, of the main chain of the alkyl group with a hetero atom such as O, S, N, or P.

The aryl group refers to a carbocyclic aromatic system including one or more aromatic rings, the rings being attached or fused together through a pendent process. Examples of the aryl group include phenyl, naphthyl, and tetrahydronaphthyl. One of more hydrogen atom of the aryl group may be substituted with the same substituent as in the alkyl group.

The heteroaryl group refers to a 5 to 30-membered aromatic ring system having 1, 2, or 3 heteroatoms selected from the group consisting of N, O, P, and S with the remaining ring atoms being C, wherein the rings may be attached or fused together through a pendent process. Furthermore, one or more hydrogen atoms of the heteroaryl group may be substituted with the same substituent as in the alkyl group.

The alkoxy group refers to a radical-O-alkyl, wherein the alkyl is as defined above. Examples of the alkoxy group include methoxy, ethoxy, propoxy, isobutyloxy, sec-butyloxy, pentyloxy, iso-amyloxy, and hexyloxy. One or more hydrogen atoms of the alkoxy group may be substituted with the same substituent as in the alkyl group.

The heteroalkoxy group refers to the alkoxy group in which at least one heteroatom, for example, O, S, or N, is present in an alkyl chain, and examples of the heteroalkoxy group include $CH_3CH_2OCH_2CH_2O-$, $C_4H_9OCH_2CH_2OCH_2CH_2O-$, and $CH_3-O-(CH_2CH_2O)_nH$.

The arylalkyl group refers to a radical formed as a result of replacing some of the hydrogen atoms of the aryl group defined above with a lower alkyl group, for example, methyl, ethyl, propyl, and the like. For example, the arylalkyl group may be benzyl, phenylethyl, and the like. One or more hydrogen atoms of the arylalkyl group may be substituted with the same substituent as in the alkyl group.

The heteroarylalkyl group refers to a radical formed as a result of replacing some of the hydrogen atoms of the heteroaryl group with a lower alkyl group. In the heteroarylalkyl group, the heteroaryl group is as defined above. One or more hydrogen atoms of the heteroaryl alkyl group may be substituted with the same substituent as in the alkyl group.

The aryloxy group refers to a radical-O-aryl, wherein the aryl is as defined above. Examples of the aryloxy group include phenoxy, naphthoxy, antracenyloxy, phenantrenyloxy, fluorenyloxy, and indenyloxy. One or more hydrogen atoms of the aryloxy group may be substituted with the same substituent as in the alkyl group.

The heteroaryloxy group refers to a radical-O-heteroaryl, wherein the heteroaryl is as defined above.

Examples of the heteroaryloxy group include benzyloxy and phenylethyloxy. One or more hydrogen atoms of the heteroaryloxy group may be substituted with the same substituent as in the alkyl group.

The cycloalkyl group refers to a monovalent monocyclic system having 5 to 30 carbon atoms. One or more hydrogen atoms of the cycloalkyl group may be substituted with the same substituent as in the alkyl group.

The heterocycloalkyl group refers to a 5 to 30-membered monovalent monocyclic system having 1, 2 or 3 heteroatoms selected from N, O, P or S with the remaining ring atom being C. One or more hydrogen atoms of the heterocycloalkyl group may be substituted with the same substituent as in the alkyl group.

The alkylester group refers to a functional group in which the alkyl group is combined with the ester group, wherein the alkyl group is as defined above.

The heteroalkyl ester group refers to a functional group in which the heteroalkyl group is combined with the ester group, wherein the heteroalkyl group is as defined above.

The arylester group refers to a functional group in which the aryl group is combined with the ester group, wherein the aryl group is as defined above.

The heteroaryl ester group refers to a functional group in which the heteroaryl group is combined with the ester group, wherein the heteroaryl group is as defined above. The amino group refers to $-NH_2$, $-NH(R)$, or $-N(R')(R'')$, wherein R' and R" are each independently a $C_1$-$C_{10}$ alkyl group.

The halogen atom may be fluorine, chlorine, bromine, iodine, or astatine, for example, fluorine.

The high-work-function and high-conductivity electrode 15 may further include a metal nanowire in addition to the conductive material and the low-surface-energy material described above. The metal nanowire may improve conductivity, optical properties, and mechanical strength of the high-work-function and high-conductivity electrode 15. The metal nanowire may be selected from the group consisting of, for example, Ag, Au, Cu, Pt, nickel silicide ($NiSi_x$), metallic carbon nanotube, and any composite, e.g., an alloy or core-shell structure, of at least two thereof, but is not limited thereto.

The high-work-function and high-conductivity electrode 15 may further include at least one of a graphene flake and dots, reduced graphene oxide, and graphite in addition to the conductive material and the low-surface-energy material described above.

The high-work-function and high-conductivity electrode 15 may further include a semiconductor nanowire in addition to the conductive material and the low-surface-energy material. The semiconductor nanowire and the metal nanowire may further improve conductivity and optical properties of the high-work-function and high-conductivity electrode 15. The semiconductor nanowire may be selected from the group consisting of Si, Ge, Si doped with B or N, Ge doped with B or N, and any composite, e.g., an alloy or core-shell structure, of at least two thereof, but is not limited thereto.

The metal nanowire and the semiconductor nanowire may have a diameter in the range of 5 nm to 100 nm and a length in the range of 500 nm to 100 μm. However, the diameter and the length of the metal nanowire and the semiconductor nanowire may vary according to methods of manufacturing the metal nanowire and the semiconductor nanowire.

The high-work-function and high-conductivity electrode 15 may further include a metal nanodot in addition to the conductive material and the low-surface-energy material described above. The metal nanodot may be selected from the group consisting of Ag, Au, Cu, Pt, and any composite, e.g., an alloy or core-shell structure, of at least two thereof, but is not limited thereto.

At least one moiety represented by —S($Z_{100}$) and —Si($Z_{101}$)($Z_{102}$)($Z_{103}$), wherein $Z_{100}$, $Z_{101}$, $Z_{102}$, and $Z_{103}$ are each independently a hydrogen atom, a halogen atom, a substituted or unsubstituted $C_1$-$C_{20}$ alkyl group, or a substituted or unsubstituted $C_1$-$C_{20}$ alkoxy group, may be attached to the surface of the metal nanowire, the semiconductor nanowire, and the metal nanodot. The moiety represented by —S($Z_{100}$) and —Si($Z_{101}$)($Z_{102}$)($Z_{103}$) is a self-assembled moiety by which a binding force within the metal nanowires, the semiconductor nanowires, and the metal nanodots may respectively be improved, or a binding force between the metal nanowire, the semiconductor nanowire, or the metal nanodot and the substrate 10 may be improved. Accordingly, electrical characteristics and mechanical strength of the high-work-function and high-conductivity electrode 15 may be improved.

The metal nanowire, the semiconductor nanowire, and/or the metal nanodot may be uniformly dispersed in the high-work-function and high-conductivity electrode 15, or non-uniformly dispersed in specific regions of the high-work-function and high-conductivity electrode 15.

For example, the metal nanowire may be formed only on the first surface 15A of the high-work-function and high-conductivity electrode 15 by forming the metal nanowire on the substrate 10 by using a known method, applying a composition for forming an electrode including the conductive material and the low-surface-energy material on the substrate 10 on which the metal nanowire is formed, and baking the structure.

The metal nanowire, the semiconductor nanowire, and the metal nanodot may be combined, i.e., physically and/or chemically combined, with at least one of the conductive material and the low-surface-energy material contained in the high-work-function and high-conductivity electrode 15 to form a composite.

The total content of low-surface-energy material in the high-work-function and high-conductivity electrode 15 may be in the range of 10 parts by weight to 500 parts by weight, for example, 20 parts by weight to 400 parts by weight, based on 100 parts by weight of the conductive material, but is not limited thereto. If the content of the low-surface-energy material is within the range described above, the high-work-function and high-conductivity electrode 15 may have the high conductivity and high work function of the second surface 15B.

If the high-work-function and high-conductivity electrode 15 is used as a transparent electrode, the thickness L of the high-work-function and high-conductivity electrode 15 may be in the range of 20 nm to 500 nm, for example, 50 nm to 200 nm. If the thickness L of the high-work-function and high-conductivity electrode 15 is within the range described above, work function, transmittance, and flexibility may be improved. Meanwhile, if the high-work-function and high-conductivity electrode 15 is used as a reflective electrode and/or wire, the thickness L of the high-work-function and high-conductivity electrode 15 may be in the range of 20 nm to 100 µm, for example, 500 nm to 5 µm. If the thickness of the high-work-function and high-conductivity electrode 15 is within the range described above, the work function and conductivity may be improved.

The high-work-function and high-conductivity electrode 15 as described above may be formed by applying a composition for forming an electrode including the conductive material, the low-surface-energy material, and a solvent to the substrate 10, and heat-treating the composition.

First, the substrate 10 may be any substrate that is commonly used in a semiconductor process. For example, the substrate 10 may include glass, sapphire, silicon, silicon oxide, metal foil, e.g., copper foil and aluminum foil, steel, e.g., stainless steel, metal oxide, polymer substrate, and any combination of at least two thereof. Examples of the metal oxide include aluminum oxide; molybdenum oxide, indium tin oxide, tin oxide, and an indium tin oxide; and examples of the polymer substrate include kapton foil, polyethersulphone (PES), polyacrylate (PAR), polyetherimide (PEI), polyethylene naphthalate (PEN), polyethylene terepthalate (PET), polyphenylene sulfide (PPS), polyallylate, polyimide, polycarbonate (PC), cellulose triacetate (TAC), cellulose acetate propinonate (CAP), and the like, but the examples are not limited thereto.

For example, the substrate 10 may be the polymer substrate as described above, but is not limited thereto.

Then, the composition for forming an electrode including the conductive material, the low-surface-energy material, and the solvent is applied to the substrate 10.

In the composition for forming an electrode, the conductive material and the low-surface-energy material are as defined above.

In the composition for forming an electrode, the solvent may be any solvent miscible with the conductive material and the low-surface-energy material and removable by heat-treatment. The solvent may be a polar solvent, and examples of the solvent include water, alcohol, e.g., methanol, ethanol, n-propanol, 2-propanol, and n-butanol, a polar organic solvent, e.g., ethylene glycol, glycerol, dimethylformamide (DMF), and dimethylsulfoxide (DMSO), or any combination of at least two thereof.

The solvent may be a mixture of at least two different materials. Alternatively, the solvent may include the polar organic solvent. For example, the solvent may be a polar organic solvent, a mixture of water and alcohol, a mixture of water and a polar organic solvent, a mixture of alcohol and a polar organic solvent, or a mixture of water, alcohol, and a polar organic solvent, and other modifications thereof are possible.

Examples of the polar organic solvent include ethylene glycol, glycerol, DMF, DMSO, and any combination of at least two thereof, but the examples are not limited thereto.

Since the polar organic solvent improves aggregating and crystallizing capabilities of the conductive polymer contained in the composition for forming an electrode, conductivity of the composition for forming an electrode and an electrode prepared by using the composition may be controlled or improved.

If the solvent includes a polar organic solvent, the content of the polar organic solvent may be in the range of 1 to 30% by weight based on 100% by weight of the composition for forming an electrode, but is not limited thereto.

For example, the high-work-function and high-conductivity electrode 15 is not formed by respectively forming the conductive material layer and the low-surface-energy material layer. Instead, the high-work-function and high-conductivity electrode 15 is formed by using one layer-forming process including applying the composition for forming an electrode including the conductive material, the low-surface-energy material, and the solvent to the substrate 10 and heat-treating the composition since the conductive material and the low-surface-energy material are self-aligned to form a concentration gradient due to a surface energy difference. Accordingly, the manufacturing process thereof is simple. Thus, the high-work-function and high-conductivity electrode 15 may be efficiently employed in the preparation of large-area electronic devices.

The high-work-function and high-conductivity electrode 15 may be used in various electronic devices. The high-work-function and high-conductivity electrode 15 has flexibility, which distinguishes it from the ITO. Thus, flexible electronic devices may be manufactured by using a flexible structure. Thus, the electronic devices may have flexibility. The flexible substrate may be the polymer substrate described above, but is not limited thereto.

The electronic devices may be devices having various known structures and performing various functions, for example, organic light-emitting devices, organic solar cells, organic memory devices, or organic thin film transistors (TFTs).

The electronic devices may be used in various electronic apparatuses such as display apparatuses, lighting lamps, and semiconductor chips.

Figure 2:
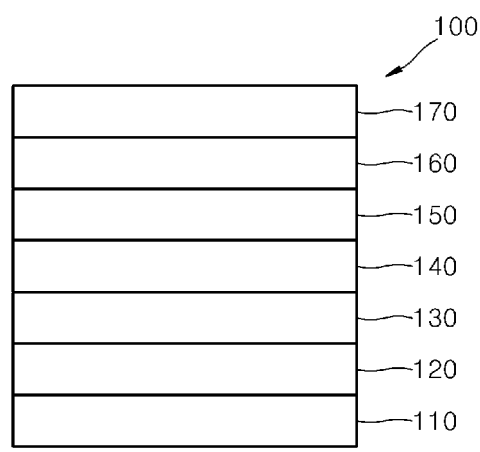
FIG. 2 is a schematic cross-sectional view of an organic light-emitting device according to an embodiment of the present invention.

FIG. 2 is a schematic cross-sectional view of an organic light-emitting device 100 including a high-work-function and high-conductivity electrode 120. The organic light emitting device 100 of FIG. 2 includes a substrate 110, a high-work-function and high-conductivity electrode 120, a hole transport layer (HTL) 130, an emission layer (EML) 140, an electron transport layer (ETL) 150, an electron injection layer (EIL) 160, and a second electrode 170. When a voltage is applied to the high-work-function and high-conductivity electrode 120 and the second electrode 170 of the organic light-emitting device 100, holes injected from the high-work-function and high-conductivity electrode 120 move to the EML 140 via the HTL 130, and electrons injected from the second electrode 170 move to the EML 140 via the ETL 150 and the EIL 160. The holes and electrons recombine in the EML 140 to generate excitons. When the excitons drop from an excited state to a ground state, light is emitted. The substrate 110 may be disposed under the high-work-function and high-conductivity electrode 120. The high-work-function and high-conductivity electrode 120 may function as an anode, and the second electrode 170 may function as a cathode.

The substrate 110 may be the substrate described above. For example, the substrate 110 may be a flexible substrate, e.g., a polymer substrate as described above.

The high-work-function and high-conductivity electrode 120 is defined as described above with reference to the high-work-function and high-conductivity electrode 15.

The organic light-emitting device 100 may not include a hole injection layer (HIL).

Thin film conductivity of a conventional HIL formed using a conductive polymer composition such as PEDOT:PSS and PANI:PSS is in a range of about $10^{-6}$ S/cm to about $10^{-2}$ S/cm. For example, PEDOT:PSS of CLEVIOUS™ P VP Al4083 (Heraeous GmbH, transferred from H.C. Starck GmbH) has a conductivity of $10^{-3}$ S/cm, and PEDOT:PSS of CLEVIOUS™ P VP CH8000 (Heraeous GmbH, transferred from H.C. Starck GmbH) has a conductivity of $10^{-6}$ S/cm. However, since a conductive polymer should have a conductivity of 0.1 S/cm or more to be used to form an electrode, PEDOT:PSS that is generally used to form a conventional HIL cannot be used. In addition, the conductive material having a conductivity of 0.1 S/cm or more according to the current embodiment cannot be used to form the HIL since crosstalk may occur between pixels of the organic light-emitting device. Thus, a conductive polymer generally used to form the HIL has been selected from materials having a conductivity of $10^{-2}$ S/cm or less and a higher work function than ITO that is commonly used in the art, thereby facilitating hole injection.

Figure 3:
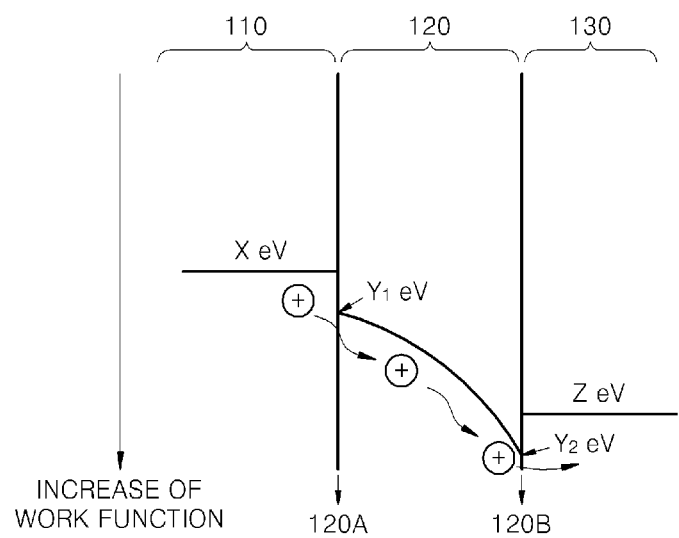
FIG. 3 schematically shows work functions of a substrate, an electrode (anode), and a hole transport layer (HTL) of the organic light-emitting device.

FIG. 3 schematically shows work functions of the high-work-function and high-conductivity electrode 120 and the HTL 130.

As shown in FIG. 3, the work function of the high-work-function and high-conductivity electrode 120 may be a variable having a gradient increasing from a first surface 120A of the high-work-function and high-conductivity electrode 120 to a second surface 120B of the high-work-function and high-conductivity electrode 120. The work function of the first surface 120A of the high-work-function and high-conductivity electrode 120 is $Y_1$ eV, and the work function of the second surface 120B is $Y_2$ eV, wherein $Y_1 < Y_2$. Thus, holes may be efficiently moved from the high-work-function and high-conductivity electrode 120 to the HTL 130 without the HIL between the high-work-function and high-conductivity electrode 120 and the HTL 130. That is, the high-work-function and high-conductivity electrode 120 plays roles of an anode and an HIL. Accordingly, the organic light-emitting device 100 including the high-work-function and high-conductivity electrode 120 may have excellent efficiency, high luminance, and long lifespan without forming the HIL. As a result, manufacturing costs for the organic light-emitting device 100 may be reduced.

The work function of the HTL 130 is Z eV, wherein Z is a real number from 5.4 to 5.6, but the work function of the HTL 130 is not limited thereto.

The work function $Y_1$ of the first surface 120A of the high-work-function and high-conductivity electrode 120 may be the same as or greater than that of the conductive material. For example, the work function $Y_1$ may be in a range of 4.6 to 5.2, for example, 4.7 to 4.9. The work function $Y_2$ of the second surface 120B of the high-work-function and high-conductivity electrode 120 may be the same as or less than that of the low-surface energy material. For example, $Y_2$ may be in a range of 5.0 to 6.5, for example, 5.3 to 6.2, but is not limited thereto.

Since the organic light-emitting device 100 does not include an HIL, the second surface 120B of the high-work-function and high-conductivity electrode 120 may be in contact with the HTL 130.

The HTL 130 may be formed by using any known method selected from the group consisting of vacuum deposition, spin-coating, casting, a Landmuir-Blodgett (LB) technique, or the like. When the HTL 130 is formed by using vacuum deposition, deposition conditions may vary according to a compound that is used to form the HTL 130, and the structure and thermal properties of the HTL 130 to be formed. For example, conditions for vacuum deposition may include a deposition temperature ranging from 100 to 500° C., a pressure ranging from $10^{-10}$ to $10^{-3}$ torr, and a deposition velocity ranging from 0.01 to 100 Å/sec. Meanwhile, when the HTL 130 is formed by using spin-coating, coating conditions may vary according to a compound that is used to form the HTL 130, and the structure and thermal properties of the HTL 130 to be formed. For example, conditions for the spin-coating may include the coating speed ranging from 2000 to 5000 rpm, and a heat-treatment temperature for removing a solvent after coating ranging from 80 to 200° C.

A material for forming the HTL 130 may be selected from materials capable of more efficiently transporting holes than injecting holes. The material for forming the HTL 130 may be any known hole transporting material. Examples of the material include an amine derivative having an aromatic condensation ring such as N,N'-di(1-naphthyl)-N,N'-diphenylbenzidine (NPB), N-phenylcarbazole, and N,N'-bis(3-methylphenyl)-N,N'-diphenyl-[1,1-biphenyl]-4,4'-diamine (TPD), and a triphenylamine-based material such as 4,4',4"-tris(N-carbazolyl)triphenylamine (TCTA). Among these materials, TCTA may not only transport holes but also inhibit excitons from being diffused from the EML 140.

The thickness of the HTL 130 may be in the range of 5 to 100 nm, for example, 10 to 60 nm. When the thickness of the HTL 130 is within this range, the HTL 130 may have excellent hole transporting properties without an increase in driving voltage.

The EML 140 may be formed by using any known method selected from the group consisting of vacuum deposition, spin-coating, casting, a LB technique, or the like. In this regard, the deposition and coating conditions may be similar to those for the formation of the HTL 130, although the deposition and coating conditions may vary according to a compound that is used to form the EML 140, and the structure and thermal properties of the EML 140 to be formed.

The EML 140 has an ionization potential that is greater than the work function of a general indium tin oxide, for example, an indium tin oxide that is not surface-treated, by 0.3 eV or more. In this regard, the work function of the indium tin oxide and the ionization potential of the EML 140 are measured using the same device under the same conditions.

The EML 140 may be formed of an emitting material or may include a host and a dopant.

Examples of the host include $Alq_3$, 4,4'-N,N'-dicarbazole-biphenyl (CBP), 9,10-di(naphthalene-2-yl)anthracene (ADN), TCTA, 1,3,5-tris(N-phenylbenzimidazole-2-yl)benzene (TPBI), 3-tert-butyl-9,10-di(naphtha-2-yl)anthracene (TBADN), E3 (refer to the following formulae), and $BeBq_2$ (refer to the following formulae), but are not limited thereto. If desired, NPB that is a material used to form the HTL 130 may also be used as a host.

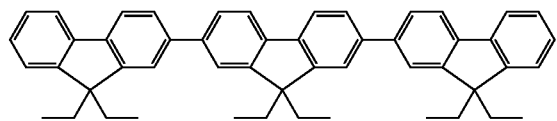

E3

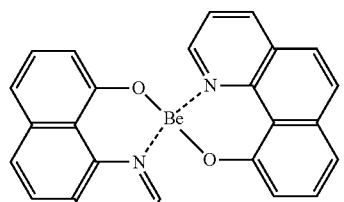

$BeBq_2$

Meanwhile, examples of known red dopants include rubrene(5,6,11,12-tetraphenylnaphthacene) (PtOEP), $Ir(piq)_3$, and $Btp_2Ir(acac)$, but are not limited thereto.

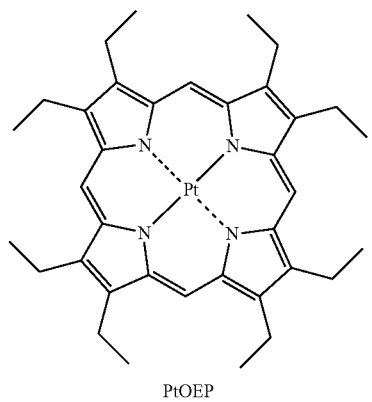

PtOEP

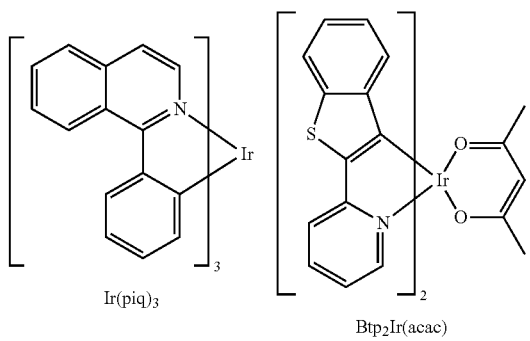

$Ir(piq)_3$ $Btp_2Ir(acac)$

Examples of known green dopants include, but are not limited to, $Ir(ppy)_3$ (ppy=phenylpyridine), $Ir(ppy)_2(acac)$, $Ir(mpyp)_3$, and 10-(2-benzothiazolyl)-1,1,7,7-tetramethyl-2,3,6,7-tetrahydro-1H,5H,11H-[1]benzopyropyrano[6,7-8-i,j]quinolizine-11-on (C545T), refer to the following formulae.

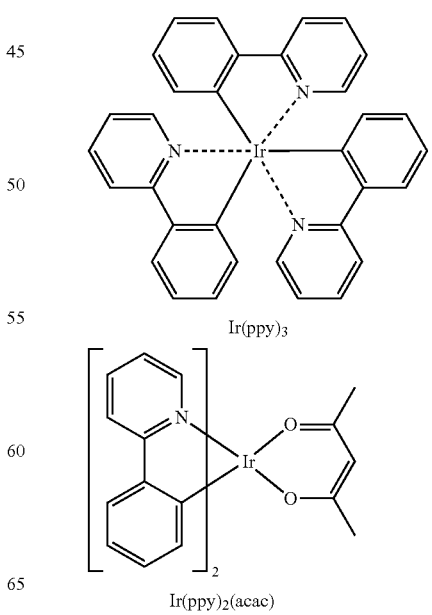

$Ir(ppy)_3$ $Ir(ppy)_2(acac)$

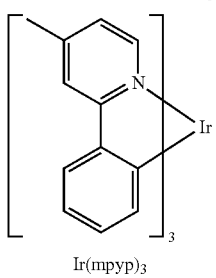

Ir(mpyp)₃

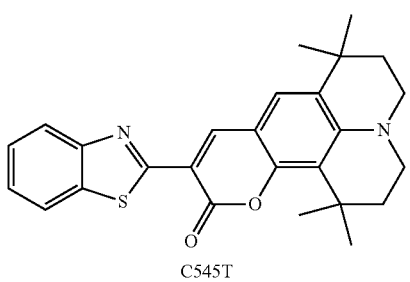

C545T

Meanwhile, examples of known blue dopants include F₂Irpic, (F₂ppy)₂Ir(tmd), Ir(dfppz)₃, ter-fluorene, 4,4'-bis(4-di-p-tolylaminostyryl)biphenyl (DPAVBi), and 2,5,8,11-tetra-t-butyl pherylene (TBP), but are not limited thereto.

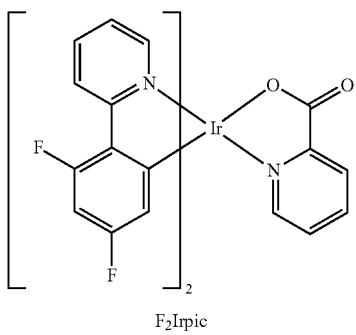

F₂Irpic

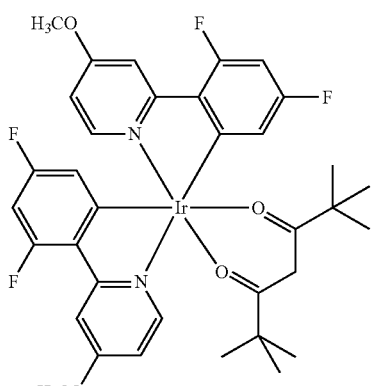

(F₂ppy)₂Ir(tmd)

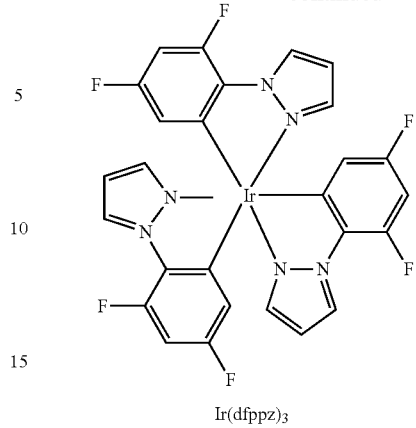

Ir(dfppz)₃

The thickness of the EML 140 may be in the range of 10 to 100 nm, for example, 10 to 60 nm. When the thickness of the EML 140 is within the range described above, the EML 140 may have excellent light-emitting characteristics without an increase in driving voltage.

A hole blocking layer (HBL) (not shown in FIG. 2) prevents diffusion of triplet excitons or holes of the EML 140 (if, the EML 140 includes a phosphorescent compound) into the second electrode 170. The HBL may be formed on the EML 140 by using any known method such as vacuum deposition, spin-coating, casting, and a LB technique. In this regard, the deposition and coating conditions may be similar to those for the formation of the HTL 130, although the deposition and coating conditions may vary according to a compound that is used to form the HBL, and the structure and thermal properties of the HBL to be formed.

A hole blocking material may be any known hole blocking material. For example, oxadiazole derivatives, triazole derivatives, and phenanthroline derivatives may be used to form the HBL.

The thickness of the HBL may be in the range of about 5 nm to about 100 nm, for example, about 10 nm to about 30 nm. When the thickness of the HBL is within the range described above, the HBL may have excellent hole blocking properties without an increase in driving voltage.

The ETL 150 may be formed on the EML 140 or the HBL by using any known method selected from the group consisting of vacuum deposition, spin-coating, casting, a LB technique, or the like. In this regard, the deposition and coating conditions may be similar to those for the formation of the HTL 130, although the deposition and coating conditions may vary according to a compound that is used to form the ETL 150, and the structure and thermal properties of the ETL 150 to be formed.

A material used to form the ETL 150 may be any known electron transporting material, for example, tris(8-quinolinorate)aluminum (Alq₃), TAZ, 4,7-diphenyl-1,10-phenanthroline (Bphen), BCP, BeBq₂, and BAlq.

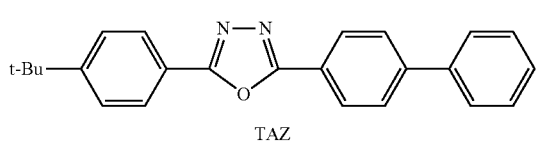

TAZ

-continued

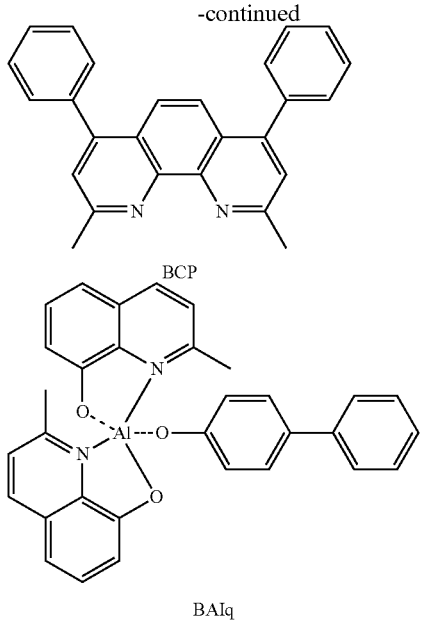

BCP

BAlq

The thickness of the ETL 150 may be in a range of about 10 to about 100 nm, for example, about 20 to about 50 nm. When the thickness of the ETL 150 is within the range described above, the ETL 150 may have excellent electron transporting properties without an increase in driving voltage.

The EIL 160 may be formed on the ETL 150. A material used to form the EIL 160 may be any known electron injecting material such as LiF, NaCl, CsF, $Li_2O$, BaO, $BaF_2$, and lithium quinolate (Liq). The deposition conditions may be similar to those for the formation of the HTL 130, although the deposition conditions may vary according to a compound that is used to form the EIL 160.

The thickness of the EIL 160 may be in the range of about 0.1 nm to about 10 nm, for example in the range of about 0.5 nm to about 5 nm. When the thickness of the EIL 160 is within the range described above, the EIL 160 may have satisfactory electron injecting properties without an increase in driving voltage.

The second electrode 170 may be a cathode, which is an electron injecting electrode. Metal, an alloy, an electrically conductive compound, or any combination thereof may be used to form the second electrode 170. In this regard, the second electrode 170 may be formed of lithium (Li), magnesium (Mg), aluminum (Al), aluminum (Al)-lithium (Li), calcium (Ca), magnesium (Mg)-indium (In), magnesium (Mg)-silver (Ag), or the like. ITO, IZO, or the like may also be used to prepare a top-emission type light-emitting diode.

The organic light-emitting device 100 may have a very high hole injecting capability by using the high-work-function and high-conductivity electrode 120 as an anode without a HIL, and may have excellent electrical characteristics by preventing electrons from being injected into the high-work-function and high-conductivity electrode 120 via the HTL 130, and may have flexibility by using a flexible substrate as the substrate 110.

The organic light-emitting device 100 of FIG. 2 has a structure in which the HTL 130 is interposed between the high-work-function and high-conductivity electrode 120 and the EML 140. However, the second surface 120B of the high-work-function and high-conductivity electrode 120 may be in contact with the EML 140 without forming the HTL 130, and other modifications thereof are possible.

Figure 4:
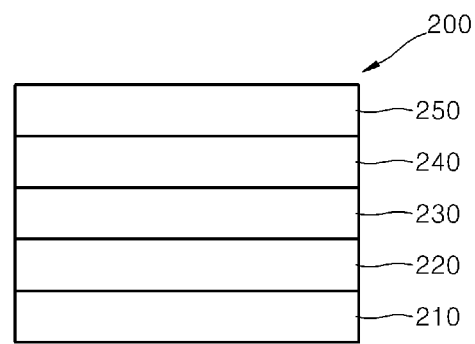
FIG. 4 is a schematic cross-sectional view of an organic solar cell according to an embodiment of the present invention.

FIG. 4 is a schematic cross-sectional view of an organic solar cell 200 including a high-work-function and high-conductivity electrode 220 according to an embodiment of the present invention.

The organic solar cell 200 of FIG. 4 includes a substrate 210, a high-work-function and high-conductivity electrode 220, a photoactive layer 230, an electron accepting layer 240, and a second electrode 250. Light arriving at the organic solar cell 200 splits into holes and electrons in the photoactive layer 230. The electrons move to the second electrode 250 via the electron accepting layer 240, and the holes move to the high-work-function and high-conductivity electrode 220.

The substrate 210 is defined as described above with reference to the substrate 110. Meanwhile, the high-work-function and high-conductivity electrode 220 is defined as described above with reference to the high-work-function and high-conductivity electrode 15.

The photoactive layer 230 may include a material capable of splitting light into holes and electrons. For example, the photoactive layer 230 may include a p-type organic semiconductor material or an n-type organic semiconductor material. For example, the photoactive layer 230 may include poly(3-hexylthiophene) and phenyl-C61-butyric acid methyl ester (PCMB), but is not limited thereto.

The photoactive layer 230 has an ionization potential that is greater than the work function of a general indium tin oxide, for example, an indium tin oxide that is not surface-treated, by 0.3 eV or more. In this regard, the work function of the indium tin oxide and the ionization potential of the photoactive layer 230 are measured using the same device under the same conditions.

The electron accepting layer 240 may include a material capable of accepting electrons, for example, the material used to form the EIL 160 of the organic light-emitting diode 100 as described above.

The second electrode 250 may be a cathode, which is an electron injecting electrode. Metal, an alloy, an electrically conductive compound, or any combination thereof, which have a relatively low work function, may be used to form the second electrode 250. In this regard, the second electrode 250 may be formed of lithium (Li), magnesium (Mg), aluminum (Al), aluminum (Al)-lithium (Li), calcium (Ca), magnesium (Mg)-indium (In), magnesium (Mg)-silver (Ag), or the like.

Since the organic solar cell 200 includes the high-work-function and high-conductivity electrode 220, holes generated in the photoactive layer 230 may efficiently move to the high-work-function and high-conductivity electrode 220 without forming a hole extraction layer between the high-work-function and high-conductivity electrode 220 and the photoactive layer 230. Thus, excellent electrical characteristics may be obtained. The hole extraction layer may include a conductive polymer, such as PEDOT:PSS and PANI:PSS, which is commonly used in a HIL of an organic light-emitting device, and conductivities of the PEDOT:PSS thin film and PANI:PSS thin film may be in a range of $10^{-6}$ S/cm to $10^{-2}$ S/cm.

The organic light-emitting device and the organic solar cell have been described with reference to FIGS. 2 and 4, but are not limited thereto. For example, the high-work-function and high-conductivity electrode 15 of FIG. 1 may also be used as a cathode of the organic light-emitting device 100 and/or the organic solar cell 200. If the high-work-function and high-conductivity electrode 15 is used as a cathode of the organic light-emitting device 100 and/or the organic solar cell 200, the second surface 15B of the high-work-function and high-conductivity electrode 15 may be disposed to face the EML 140 of the organic light-emitting device 100 and/or the photoactive layer 230 of the organic solar cell 200. For example, when the cathode 170 of the organic light-emitting device 100 of FIG. 2 is a high-work-function and high-conductivity electrode 15, the second surface 15B of the high-work-function and high-conductivity electrode 15, i.e., the surface having a relatively high concentration of the low-surface-energy material, may be disposed to face the EIL 160 disposed under the cathode 170, and other modifications thereof are possible. In this regard, the high-work-function and high-conductivity electrode 15 used as the cathode 170 may be formed on a base film and transferred onto the EIL 160 by using, for example, a laser induced thermal imaging (LITI) process or a transfer printing process.

In addition, when the high-work-function and high-conductivity electrode 15 is used as the cathode 170, the second surface 15B may face the opposite side of the photoactive layer 230.

In addition, the high-work-function and high-conductivity electrode 15 may be used an inverted organic light-emitting diode (OLED) or organic photovoltaic (OPV). In the inverted OLED or OPV, a HIL (OLED) or a hole extraction layer (OPV) may be disposed under the high-work-function and high-conductivity electrode 15, and an EIL or electron accepting layer may be disposed on the anode formed on the substrate.

Figure 5:
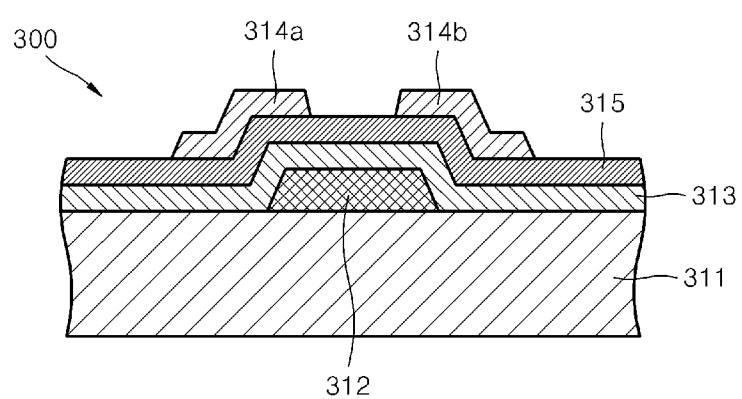
FIG. 5 is a schematic cross-sectional view of an organic thin film transistor (TFT) according to an embodiment of the present invention.

FIG. 5 is a schematic cross-sectional view of an organic thin film transistor (TFT) 300 including a high-work-function and high-conductivity electrode.

The organic TFT 300 of FIG. 5 includes a substrate 311, a gate electrode 312, an insulating layer 313, an organic semiconductor layer 315, and source and drain electrodes 314a and 314b. At least one of the gate electrode 312 and the source and drain electrodes 314a and 314b may be the high-work-function and high-conductivity electrode 15 as described above.

The substrate 311 is defined as described above with reference to the substrate 110.

The gate electrode 312 having a predetermined pattern is formed on the substrate 311. The gate electrode 312 may be the high-work-function and high-conductivity electrode 15 as described above. Alternatively, the gate electrode 312 may be formed of a metal such as gold (Au), silver (Ag), copper (Cu), nickel (Ni), platinum (Pt), palladium (Pd), aluminum (Al), and molybdenum (Mo), or a metal alloy such as Al:Nd and Mo:W, but is not limited thereto.

The insulating layer 313 is formed on the gate electrode 312 to cover the gate electrode 312. The insulating layer 313 may include an inorganic material such as a metal oxide or metal nitride, an organic material such as a flexible organic polymer, or various other materials.

The organic semiconductor layer 315 is formed on the insulating layer 313. The organic semiconductor layer 315 may include pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, poly(p-phenylene vinylene) and derivatives thereof, poly(p-phenylene) and derivatives thereof, polyfluorene and derivatives thereof, polythiophenevinylene and derivatives thereof, polythiophene-hetero ring aromatic copolymer and derivatives thereof, oligoacene of naphthalene and derivatives thereof, oligothiophene of α-5-thiophene and derivatives thereof, phthalocyanine containing or not containing a metal and derivatives thereof, pyromellitic dianhydride and derivatives thereof, or pyromellitic diimide and derivatives thereof, but the organic semiconductor layer 315 is not limited thereto.

The source and drain electrodes 314a and 314b' are respectively formed on the organic semiconductor layer 315. The source and drain electrodes 314a and 314b may overlap with a portion of the gate electrode 312 as shown in FIG. 5, but are not limited thereto. The source and drain electrodes 314a and 314b may be the high-work-function and high-conductivity electrode 15 as described above. Alternatively, the source and drain electrodes 314a and 314b may include a noble metal having a work function of 5.0 eV or more, for example, gold (Au), palladium (Pd), platinum (Pt), nickel (Ni), rhodium (Rh), ruthenium (Ru), iridium (Ir), osmium (Os), or a combination of at least two thereof in consideration of a work function of the material used to form the organic semiconductor layer 315.

Electronic devices have been described above with reference to FIGS. 2 to 5, but are not limited thereto.

EXAMPLES

Example 1

Preparation of High-Work-Function and High-Conductivity Electrode (I)

A composition for forming an electrode (100% by weight) including a highly conductive poly(3,4-ethylenedioxythiophene):poly(styrenesulfonate)(PEDOT:PSS) solution having a conductivity of 0.3 S/cm (PH500 manufactured by H.C. Starck GmbH, wherein the content of PSS per 1 part by weight of PEDOT was 2.5 parts by weight), a Polymer 100 solution (prepared by dispersing Polymer 100 represented by the following formula in a mixture of water and alcohol (water:alcohol=4.5:5.5(v/v)) to a 5% by weight, Aldrich Co.) and 5% by weight of dimethylsulfoxide (DMSO) was prepared. In this regard, the ratio of the PEDOT:PSS solution and the Polymer 100 solution was adjusted such that the content (solid content) of Polymer 100 per 1 part by weight of the PEDOT was 1.0 part by weight. A thin film having a thickness of 100 nm and formed using the composition for forming an electrode had a conductivity of 125 S/cm.

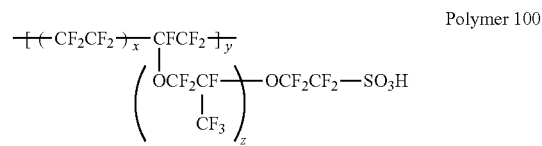

Polymer 100

In Polymer 100, x=1300, y=200, and x=1.

The composition for forming an electrode was spin-coated on a polyethylene terephthalate (PET) substrate and heat-treated at 150° C. for 30 minutes to form Electrode 1 having a thickness of 100 nm.

Then, Electrodes 2, 3 and 4 were prepared on the PET substrate in the same manner as in the preparation of Electrode 1, except that the ratios of the PEDOT:PSS solution to the Polymer 100 solution were respectively adjusted such that the contents of Polymer 100 per 1 part by weight of PEDOT were respectively 2.3 parts by weight, 4.9 parts by weight, and 11.2 parts by weight, wherein the surface of Electrodes 1 to 4 contacting with the PET substrate was a first surface, and the opposite surface thereof was a second surface.

Conductivities of Electrodes 1, 2, 3 and 4 measured using a 4-point probe were respectively 125, 75, 61, and 50 S/cm.

Comparative Example A

Electrode A was prepared in the same manner as in the preparation of Electrode 1, except that a composition including the PEDOT:PSS solution and 5% by weight of DMSO but not including the Polymer 100 solution was used.

Evaluation Example 1

Evaluation of Electrode (I)

<Evaluation of Molecular Concentration with Respect to Depth of Electrode>

Figure 6:
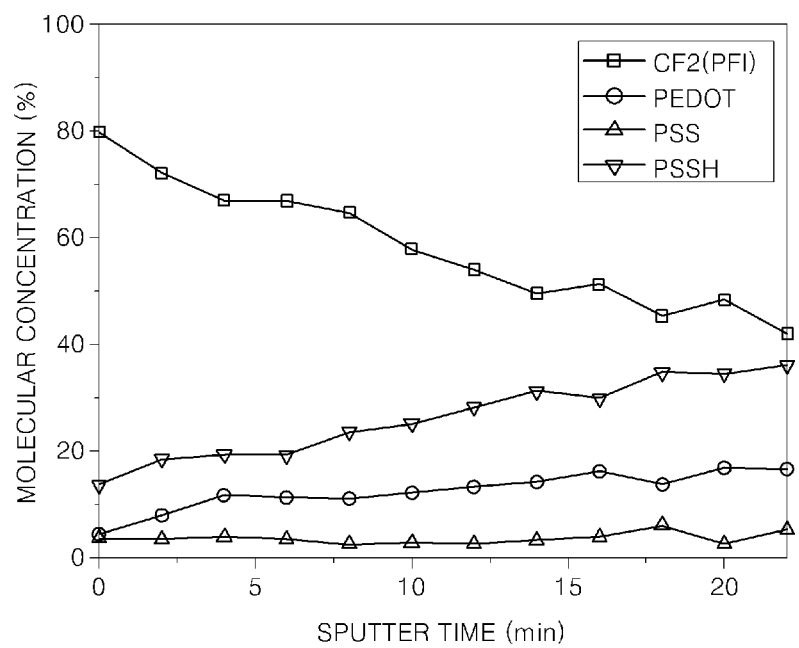
FIG. 6 is a graph illustrating an X-ray photoelectron spectroscopy (XPS) spectrum that shows molecular concentrations of Electrode 4 prepared according to Example 1 with respect to sputter time.

Molecular concentration in the surface of Electrodes 1 to 4 and A (i.e., the second surface) was evaluated by using X-ray photoelectron spectroscopy (XPS, manufactured by VG Scientific, Model No. ESCALAB 220iXL), and the results are shown in Table 1. FIG. 6 shows an XPS spectrum of Electrode 4 with respect to sputter time, i.e., depth of Electrode 4. A concentration of each moiety was evaluated by analyzing a peak of PEDOT (164.5 eV), peaks (S2p) of PSS and PSSH (168.4 and 168.9 eV), and a peak of Polymer 100 ($CF_2$, F1s).

Referring to FIG. 6, the concentration of $CF_2$ moiety indicating the concentration of Polymer 100 substantially decreased but the concentration of PEDOT substantially increased in a direction from the second surface (sputter time=0 sec.) of Electrode 4 to the first surface of Electrode 4. Thus, the concentrations of PEDOT:PSS and Polymer 100 in Electrode 4 had concentration gradients according to the depth of Electrode 4.

In Table 1, fluorine/PSS ratios calculated from areas of the PSS peak (S2p) and the fluorine peak (F1s) of the second surface of Electrodes 1 to 4 are listed. Referring to Table 1, as the amount of Polymer 100 increases, the content of Polymer 100 on the surface, i.e., the second surface, of Electrodes 1 to 4 increases.

TABLE 1

| | PEDOT/PSS/ Polymer 100 (Weight ratio) | PSS peak area | Fluorine peak area | Fluorine/ PSS ratio |
|---|---|---|---|---|
| Electrode 4 | 1/2.5/11.2 | 220.0718 | 3571.604 | 8.764 |
| Electrode 3 | 1/2.5/4.9 | 508.1833 | 7793.913 | 8.282 |
| Electrode 2 | 1/2.5/2.3 | 412.4424 | 4589.502 | 6.001 |
| Electrode 1 | 1/2.5/1.0 | 696.8955 | 7118.15 | 5.516 |
| Electrode A | 1/2.5/0 | 311.484 | 0 | — |

<Evaluation of Work Function and Conductivity>

The work functions of Electrodes 1 to 4 and A were measured using an ultraviolet photoelectron spectroscopy in air (manufactured by Niken Keiki, Model No. AC2), and the results are shown in Table 2.

TABLE 2

| | PEDOT/PSS/Polymer 100 (Weight ratio) | Work function (eV) |
|---|---|---|
| Electrode A | 1/2.5/0 | 4.73 |
| Electrode 1 | 1/2.5/1.0 | 5.07 |
| Electrode 2 | 1/2.5/2.3 | 5.23 |
| Electrode 3 | 1/2.5/4.9 | 5.64 |
| Electrode 4 | 1/2.5/11.2 | 5.80 |

Since the work functions were evaluated with respect to Electrodes 1 to 4 and A formed on the PET substrate, the work functions shown in Table 2 may be regarded as work functions of the second surface of each of Electrodes 1 to 4.

<Evaluation of Optical Transmittance>

Figure 7:
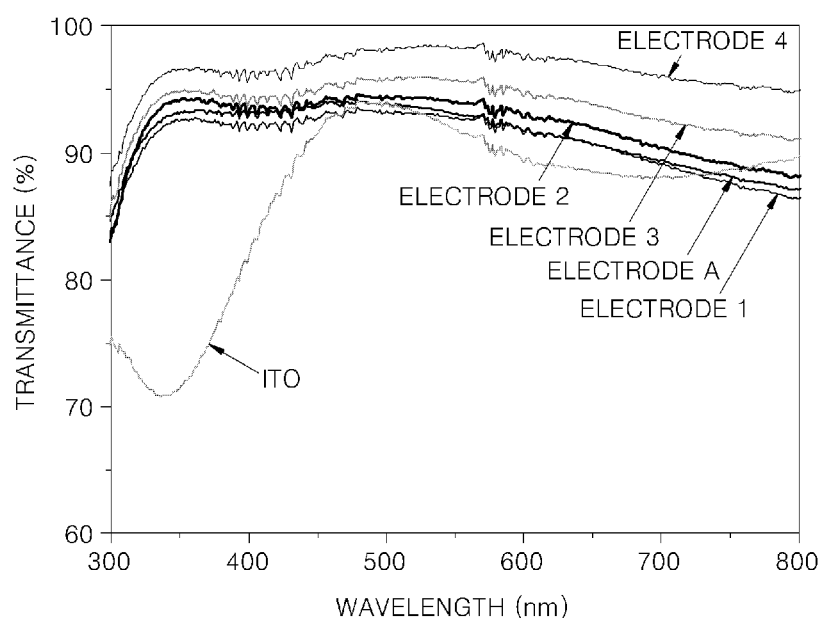
FIG. 7 is a graph illustrating light transmittance of Electrodes 1 to 4 and A prepared according to Example 1 and Comparative Example A.

Optical transmittance of Electrodes 1 to 4 and A was evaluated using an UV-spectrometer (SCINCO (S-3100)), and the results are shown in FIG. 7. For comparison, Optical transmittance of ITO having a thickness of 100 nm was also shown. Referring to FIG. 7, Electrodes 1 to 4 had excellent Optical transmittance, for example, excellent transmittance of visible light, particularly, excellent transmittance of blue visible light.

<Evaluation of Surface Characteristics>

Surface roughness of the surface, i.e., the second surface, of Electrodes 1 to 4 and A was evaluated using an Atomic Force Microscopy, and the results are shown in Table 3.

TABLE 3

| Electrode No. | 4 | 3 | 2 | 1 | A |
|---|---|---|---|---|---|
| Surface roughness (nm) | 0.425 | 0.471 | 0.367 | 0.572 | 0.847 |

Referring to Table 3, Electrodes 1 to 4 had lower surface roughness than Electrode A. The surface of Electrodes 1 to 4 became flat by adding Polymer 100 thereto.

<Evaluation of Hole Mobility and Hole Injecting Efficiency>

Figure 8:
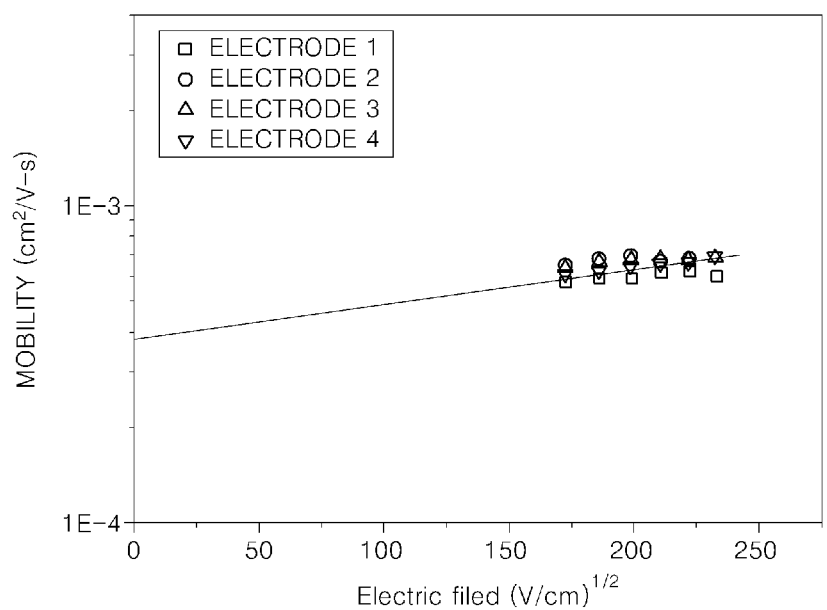
FIG. 8 is a graph illustrating hole mobility of Electrodes 1 to 4 prepared according to Example 1.
Figure 9:
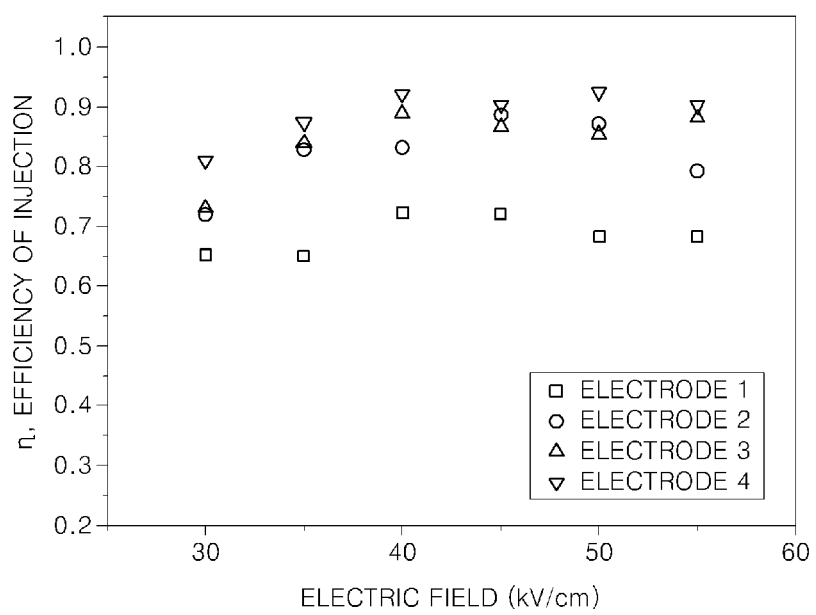
FIG. 9 is a graph illustrating hole injection efficiency of Electrodes 1 to 4 prepared according to Example 1.

Hole mobility and hole injecting efficiency of Electrodes 1 to 4 were evaluated, and the results are respectively shown in FIGS. 8 and 9. Dark injection space-charge-limited-current (DI SCLC) transients were used when the hole mobility and hole injection efficiency were measured. A hole-only device having an electrode (Electrodes 1, 2, 3, or 4)/NPB layer (about 2.6 μm)/Al structure was prepared and the DI SCLC transients were performed. While the DI SCLC transients were performed, a pulse generator (HP 214B) and a digital oscilloscope (Agilent Infiniium 54832B) were used. Referring to FIGS. 8 and 9, Electrodes 1 to 4 have excellent hole mobility and hole injection efficiency.

Example 2

Preparation of OLED

Electrode 1, as an anode, was formed on the PET substrate according to Example 1, and then a NPB HTL having a thickness of 20 nm, a $Bebq_2$:C545T EML having a thickness of 30 nm, wherein the content of C545T was 1.5% by weight, a $Bebq_2$ ETL having a thickness of 20 nm, a Liq ETL having a thickness of 1 nm, and an Al cathode having a thickness of 130 nm were sequentially formed on the second surface of Electrode 1 by vacuum deposition to prepare OLED 1. OLEDs 2 to 4 were prepared in the same manner as in the preparation of OLED 1 respectively using Electrodes 2 to 4 instead of Electrode 1.

Comparative Example 1

OLED A was prepared in the same manner as in Example 2, except that Electrode A prepared according to Comparative Example A was used instead of Electrode 1.

Comparative Example 2

A Corning 15 Ω/cm (1200 Å) ITO glass substrate was used instead of the PET substrate on which Electrode 1 is formed. That is, comparing with Example 2, a glass substrate was used instead of the PET substrate, and an ITO electrode was used instead of Electrode 1. A PEDOT:PSS solution (CLEVIOS™ P VP AI4083), wherein the content of PSS per 1 part by weight of PEDOT was 6 parts by weight, was spin-coated on the ITO electrode, and baked at 150° C. for 30 minutes to form a PEDOT:PSS HIL having a thickness of 50 nm. A NPB HTL having a thickness of 20 nm, a Bebq$_2$:C545T EML having a thickness of 30 nm, wherein the content of C545T was 1.5% by weight, a Bebq$_2$ ETL having a thickness of 20 nm, a Liq ETL having a thickness of 1 nm, and an Al cathode having a thickness of 130 nm were sequentially formed on the HIL by vacuum deposition to prepare OLED B.

Comparative Example 3

OLED C was prepared in the same manner as in Comparative Example 2, except that 2TNATA was deposited on the ITO electrode to form a 2TNATA HIL having a thickness of 50 nm instead of the PEDOT:PSS HIL.

The structures and flexibility of OLEDs 1 to 4 and A to C are shown in Table 4 below.

TABLE 4

| | substrate | Anode | HIL | Flexibility |
|---|---|---|---|---|
| OLED 1 | PET | Electrode 1 (100 nm) (PEDOT/PSS/Polymer 100 = 1/2.5/1.0) | — | ○ |
| OLED 2 | PET | Electrode 2 (100 nm) (PEDOT/PSS/Polymer 100 = 1/2.5/2.3) | — | ○ |
| OLED 3 | PET | Electrode 3 (100 nm) (PEDOT/PSS/Polymer 100 = 1/2.5/4.9) | — | ○ |
| OLED 4 | PET | Electrode 4 (100 nm) (PEDOT/PSS/Polymer 100 = 1/2.5/11.2) | — | ○ |
| OLED A | PET | Electrode 1 (100 nm) (PEDOT:PSS) | — | ○ |
| OLED B | Glass | ITO electrode (120 nm) | PEDOT/PSS 50 nm | X |
| OLED C | Glass | ITO electrode (120 nm) | 2TNATA 50 nm | X |

○: Very high (OLED was not brittle after bending the OLED 100 times under a radius curvature of 0.75 cm and a strain of 1.25%)
X: Low (OLED was brittle after bending the OLED 100 times at a radius curvature of 0.75 cm and a strain of 1.25%)

Evaluation Example 2

Evaluation of OLED

Figure 10:
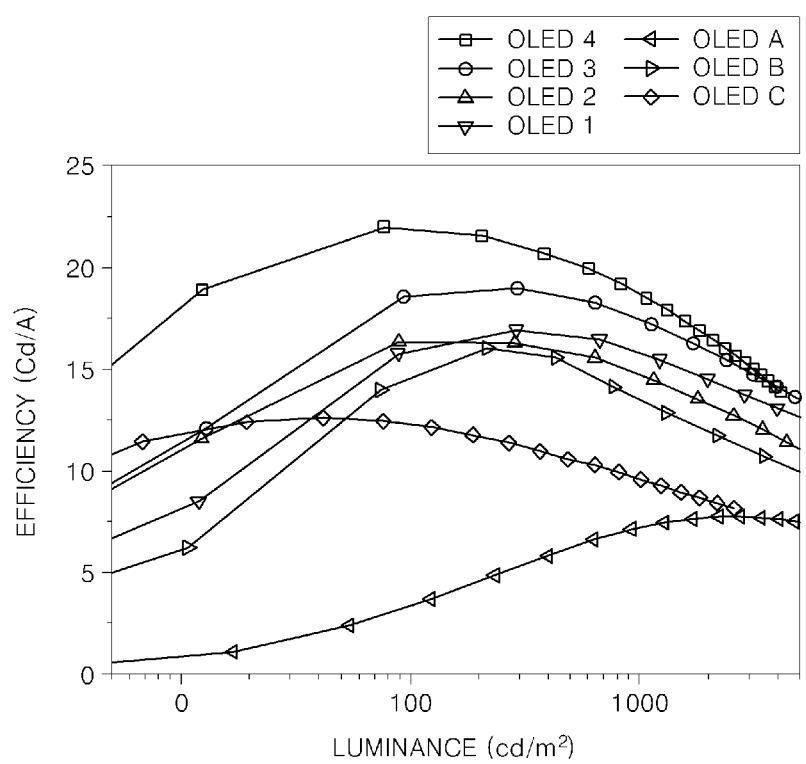
FIG. 10 is a graph illustrating efficiency of organic light-emitting diodes (OLEDs) 1 to 4 and A to B prepared according to Example 2 and Comparative Examples 1 to 3 with respect to luminance.
Figure 11:
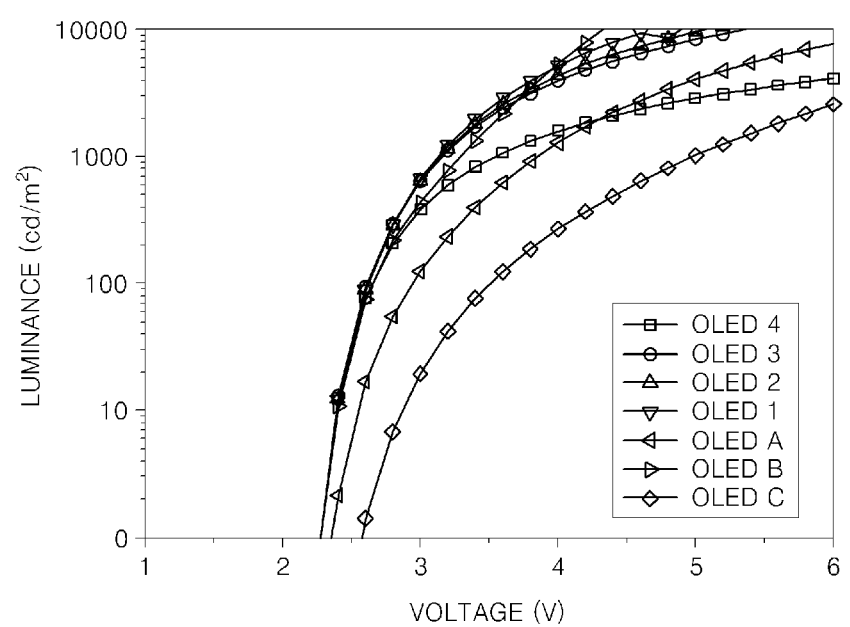
FIG. 11 is a graph illustrating luminance of OLEDs 1 to 4 and A to B prepared according to Example 2 and Comparative Examples 1 to 3 with respect to voltage.
Figure 12:
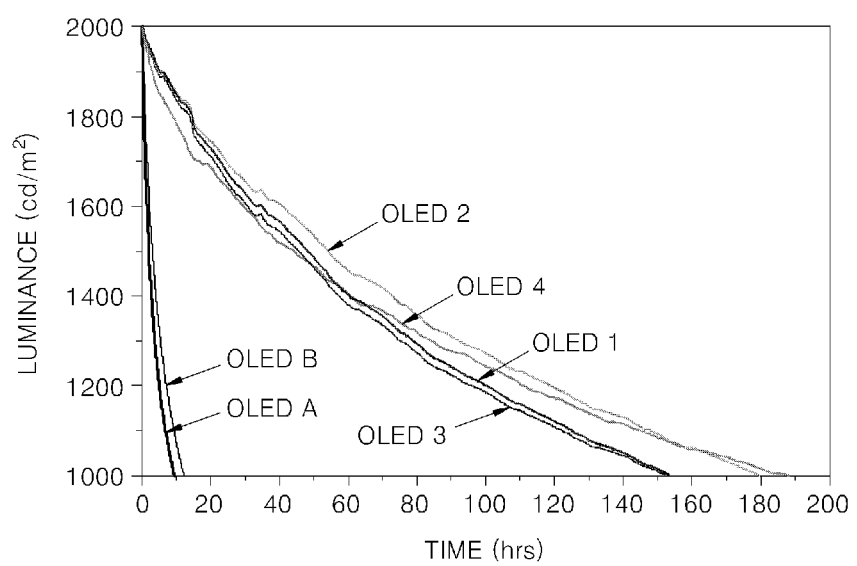
FIG. 12 is a graph illustrating luminance of OLEDs 1 to 4 and A to B prepared according to Example 2 and Comparative Examples 1 to 3 with respect to time.

Efficiency, luminance, and lifespan of OLEDs 1 to 4 and A to C were evaluated using a Keithley 236 source measure unit and a Minolta CS 2000 spectroradiometer, and the results are shown in FIGS. 10 to 12.

Referring to FIGS. 10 to 12, OLEDs 1 to 4 were determined to have better efficiency, higher luminance, and longer lifespan than OLEDs A to C.

Example 3

Preparation of High-Work-Function and High-Conductivity Electrode (II)

A composition for forming an electrode (100% by weight) including a highly conductive poly(3,4-ethylenediox-ythiophene):poly(styrenesulfonate)(PEDOT:PSS) solution having a conductivity of 0.3 S/cm (CLEVIOS™ PH500 manufactured by Heraeus GmbH. & Co (Formerly, H. C. Starck GmbH)), wherein the content of PSS per 1 part by weight of PEDOT was 2.5 parts by weight), 2% by weight of 3,3,3-trifluoropropyl)trichlorosilane (CF$_3$CH$_2$CH$_2$SiCl$_3$), as a fluorinated oligomer, (manufactured by Aldrich Co.), and 5% by weight of dimethylsulfoxide (DMSO), was prepared. The composition for forming an electrode was spin-coated on a PET substrate and heat-treated at 150° C. for 30 minutes to form Electrode 5 having a thickness of 100 nm. Electrode 5 had a conductivity of 350 S/cm and a work function of 5.25 eV.

Example 4

Preparation of High-Work-Function and High-Conductivity Electrode (II)

The composition for forming Electrode 4 of Example 1 was prepared, wherein the weight ratio of the PEDOT:PSS solution and the Polymer 100 solution was adjusted such that the content of Polymer 100 per 1 part by weight of PEDOT was 11.2 parts by weight. Then, 5% by weight of a silver nanowire (Model No. ST164, Length: 7.2 μm, Diameter: 52 nm, Seashell Technology, LLC) was added to 100% by weight of the composition.

The composition including the silver nanowire was spin-coated on the PET substrate and heat-treated at 150° C. for 30 minutes to form Electrode 6 having a thickness of 100 nm. Electrode 6 had a work function of 5.8 eV and a conductivity of 85 S/cm.

As described above, according to the one or more of the above embodiments of the present invention, the high-work-function and high-conductivity electrode may be used as an anode of various electronic devices, particularly, organic light-emitting devices and organic solar cells. In this regard, since the high-work-function and high-conductivity electrode has high work function, an HIL, and/or an HTL, or a hole extraction layer for controlling work function with the EML or the photoactive layer are not required. Thus, electronic devices may be simplified by using the high-work-function and high-conductivity electrode, and thus manufacturing costs thereof may be reduced. Furthermore, since the high-work-function and high-conductivity electrode is a polymer-based electrode, it may be efficiently applied to flexible electronic devices as well as flat panel electronic devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device employing a high-work-function and high-conductivity electrode that comprises a conductive material having a conductivity of 0.1 S/cm or more and a low-surface-energy material and has a first surface and a second surface opposite to the first surface, wherein the concentration of the low-surface-energy material in the second surface is greater than that of the low-surface-energy material of the first surface, and a work function of the second surface is 5.0 eV or more.

2. The electronic device of claim 1, wherein the concentration of the low-surface-energy material gradually increases in a direction from the first surface to the second surface.

3. The electronic device of claim 1, wherein the low-surface-energy material is a fluorinated material having at least one fluorine (F).

4. The electronic device of claim 1, wherein the low-surface-energy material is a fluorinated polymer having a repeating unit represented by one of Formulae 1 to 3 below:

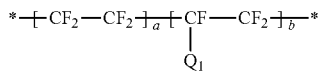

Formula 1 wherein a is a number from 0 to 10,000,000; b is a number of 1 to 10,000,000; and $Q_1$ is $—[O—C(R_1)(R_2)—C(R_3)(R_4)]_c—[OCF_2CF_2]_d—R_5$, $—COOH$, or $—O—R_f—R_6$, wherein $R_1$, $R_2$, $R_3$ and $R_4$ are each independently —F, $—CF_3$, $—CHF_2$ or $—CH_2F$;

c and d are each independently a number from 0 to 20;

$R_f$ is $—(CF_2)_2—$, or $—(CF_2CF_2O)_z—CF_2CF_2—$, wherein z is an integer from 1 to 50; and $R_5$ and $R_6$ are each independently $—SO_3M$, $—PO_3M_2$, or —CON, wherein M is $Na^+$, $K^+$, $Li^+$, $H^+$, $CH_3(CH_2)_wNH_3^+$, $NH_4^+$, $NH_2^+$, $NHSO_2CF_3^+$, $CHO^+$, $C_2H_5OH^+$, $CH_3OH^+$, or $CH_3(CH_2)_wCHO^+$, wherein w is an integer from 0 to 50,

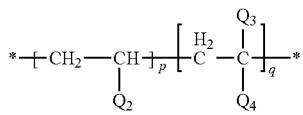

Formula 2 wherein $Q_2$ is a hydrogen atom, a substituted or unsubstituted $C_5$-$C_{60}$ aryl group, or —COOH;

$Q_3$ is a hydrogen atom or a substituted or unsubstituted $C_1$-$C_{20}$ alkyl group;

$Q_4$ is $—O—(CF_2)_r—SO_3M$, $—O—(CF_2)_r—PO_3M_2$, $—O—(CF_2)_r—CO_2M$, or $—CO—NH—(CH_2)_s—(CF_2)_t—CF_3$, wherein r, s and t are each independently a number from 0 to 20; and M is $Na^+$, $K^+$, $Li^+$, $H^+$, $CH_3(CH_2)_wNH_3^+$, $NH_4^+$, $NH_2^+$, $NHSO_2CF_3^+$, $CHO^+$, $C_2H_5OH^+$, $CH_3OH^+$, or $CH_3(CH_2)_wCHO^+$, wherein w is an integer from 0 to 50,

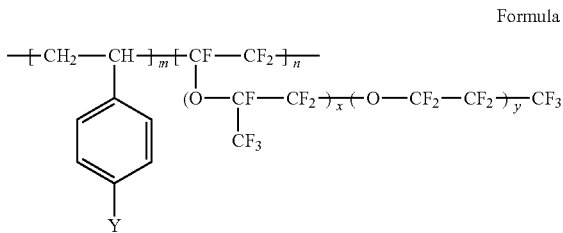

Formula 3 wherein $0 \le m < 10{,}000{,}000$, and $0 < n \le 10{,}000{,}000$;

x and y are each independently a number from 0 to 20; and

Y is $—SO_3M$, $—PO_3M_2$, or $—CO_2M$;

wherein M is $Na^+$, $K^+$, $Li^+$, $H^+$, $CH_3(CH_2)_wNH_3^+$, $NH_4^+$, $NH_2^+$, $NHSO_2CF_3^+$, $CHO^+$, $C_2H_5OH^+$, $CH_3OH^+$, or $CH_3(CH_2)_wCHO^+$, wherein w is an integer from 0 to 50.

5. The electronic device of claim 1, wherein the low-surface-energy material is a fluorinated oligomer represented by Formula 10 below:

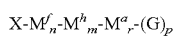

Formula 10 wherein

X is a terminal group;

$M^f$ is a unit derived from a fluorinated monomer prepared by condensation reaction of perfluoropolyether alcohol, polyisocyanate, and an isocyanate reactive-non-fluorinated monomer or a fluorinated $C_1$-$C_{20}$ alkylene group;

$M^h$ is a unit derived from a non-fluorinated monomer;

$M^a$ is a unit having a silyl group represented by $—Si(Y_4)(Y_5)(Y_6)$, wherein, $Y_4$, $Y_5$ and $Y_6$ are each independently a halogen atom, a substituted or unsubstituted $C_1$-$C_{20}$ alkyl group, a substituted or unsubstituted $C_6$-$C_{30}$ aryl group, or a hydrolysable substituent, wherein at least one of the $Y_4$, $Y_5$ and $Y_6$ is a hydrolysable substituent, G is a monovalent organic group including a chain transfer agent;

n is a number from 1 to 100, m is a number from 0 to 100, r is a number from 0 to 100;

wherein n+m+r≥2, and p is a number from 0 to 10.

6. The electronic device of claim 1, wherein the conductive material comprises polythiophene, polyaniline, polypyrrole, polystyrene, sulfonated polystyrene, poly(3,4-ethylenedioxythiophene), self-doped conductive polymer, any derivative thereof, or any combination thereof.

7. The electronic device of claim 1, wherein the high-work-function and high-conductivity electrode further comprises at least one of a metal nanowire, a semiconductor nanowire, a metal nanodot, carbon nanotube, graphene, reduced graphene oxide, and graphite.

8. The electronic device of claim 7, wherein at least one moiety represented by $—S(Z_{100})$ or $—Si(Z_{101})(Z_{102})(Z_{103})$ is attached to the surface of the metal nanowire, the semiconductor nanowire, and the metal nanodot, wherein $Z_{100}$, $Z_{101}$, $Z_{102}$, and $Z_{103}$ are each independently a hydrogen atom, a halogen atom, a substituted or unsubstituted $C_1$-$C_{20}$ alkyl group, or a substituted or unsubstituted $C_1$-$C_{20}$ alkoxy group.

9. The electronic device of claim 1, wherein the high-work-function and high-conductivity electrode is prepared by using a composition for forming an electrode comprising the conductive material, the low-surface-energy material, and a solvent, wherein the solvent comprises at least one polar organic solvent selected from the group consisting of ethylene glycol, glycerol, dimethylformamide (DMF), and dimethylsulfoxide (DMSO).

10. The electronic device of claim 1, wherein a work function of the second surface is in the range of 5.0 eV to 6.5 eV.

11. The electronic device of claim 1, wherein the electronic device comprises an organic light-emitting device, an organic solar cell, an organic memory device, or an organic thin film transistor (TFT).

12. The electronic device of claim 1, wherein the electronic device is an organic light-emitting device that comprises: an anode; a cathode; and an emission layer interposed between the anode and cathode and having an ionization potential greater than a work function of indium tin oxide, by 0.3 eV or more, the high-work-function and high-conductivity electrode is the anode of the organic light-emitting device, and the second surface of the high-work-function and high-conductivity electrode faces the emission layer.

13. The electronic device of claim 12, wherein the second surface of the high-work-function and high-conductivity electrode contacts the emission layer.

14. The electronic device of claim 12, wherein a hole transport layer (HTL) is interposed between the high-workfunction and high-conductivity electrode and the emission layer, and the second surface of the high-work-function and high-conductivity electrode contacts the HTL.

15. The electronic device of claim 1, wherein the electronic device is an organic solar cell that comprises: an anode; a cathode; and a photoactive layer interposed between the anode and the cathode and having an ionization potential greater than a work function of indium tin oxide, by 0.3 eV or more, the high-work-function and high-conductivity electrode is the anode of the organic solar cell, and the second surface of the high-work-function and high-conductivity electrode faces the photoactive layer.

16. The electronic device of claim 15, wherein the second surface of the high-work-function and high-conductivity electrode contacts the photoactive layer.

* * * * *